United States Patent [19]

Morich et al.

[11] Patent Number: 5,424,643
[45] Date of Patent: Jun. 13, 1995

[54] MAGNETIC RESONANCE GRADIENT SHEET COILS

[75] Inventors: Michael A. Morich, Mentor; John L. Patrick, Chagrin Falls; Gordon D. DeMeester, Wickliffe, all of Ohio

[73] Assignee: Picker International, Inc., Highland Hts., Ohio

[21] Appl. No.: 80,564

[22] Filed: Jun. 21, 1993

Related U.S. Application Data

[63] Continuation-in-part of Ser. No. 942,521, Sep. 9, 1992, Ser. No. 859,152, Mar. 27, 1992, Ser. No. 859,154, Mar. 27, 1992, and Ser. No. 922,162, Jul. 29, 1992, which is a continuation of Ser. No. 919,215, Jul. 24, 1992, and Ser. No. 30,601, Mar. 11, 1993, which is a continuation of Ser. No. 805,016, Dec. 11, 1991, abandoned, which is a continuation-in-part of Ser. No. 719,334, Jun. 21, 1991, Pat. No. 5,177,441, which is a continuation-in-part of Ser. No. 368,047, Jun. 16, 1989, Pat. No. 5,036,282.

[51] Int. Cl.6 ............................................. G01R 33/20
[52] U.S. Cl. .................................................... 324/318
[58] Field of Search ................. 335/216; 324/300, 307, 324/309, 318, 319, 320, 322; 128/653.2, 653.5

[56] References Cited

U.S. PATENT DOCUMENTS

| | | | |
|---|---|---|---|
| 4,646,024 | 2/1987 | Schenck et al. | 324/318 |
| 4,733,189 | 3/1988 | Punchard et al. | 324/318 |
| 4,737,716 | 4/1988 | Roemer et al. | 324/319 |
| 4,794,338 | 12/1988 | Roemer et al. | 324/39 |
| 4,840,700 | 6/1989 | Edelstein et al. | 156/634 |
| 4,902,995 | 2/1990 | Vermilyea | 335/216 |
| 4,924,198 | 5/1990 | Laskaris | 335/216 |
| 4,926,125 | 5/1990 | Roemer | 324/318 |
| 4,935,714 | 6/1990 | Vermilyea | 335/299 |
| 5,036,282 | 7/1991 | Morich et al. | 324/318 |
| 5,177,441 | 1/1993 | Morich et al. | 324/318 |
| 5,177,442 | 1/1993 | Roemer | 324/318 |

FOREIGN PATENT DOCUMENTS

317853A1 5/1989 European Pat. Off. .

OTHER PUBLICATIONS

"Coils of Minimum Inductance", Turner, SMRM Book of Abstracts, Aug. 1988 p. 26.
"A New Method of Gradient Coil Design in MRI", Fujita, et al., SMRM Book of Abstracts, Aug. 1988, p. 27.
"Passive Screening of Switched Magnetic Field Gradients", Turner, et al. J. Phys. E. Sci. Instrum. 19 (1986) pp. 876-879.
"A Target Field Approach to Optimal Coil Design", Turner J. Phys. D: Appl. Phys. 19, (1986) L147-L151.

Primary Examiner—Michael J. Tokar
Attorney, Agent, or Firm—Fay, Sharpe, Beall, Fagan, Minnich & McKee

[57] ABSTRACT

A magnetic resonance imaging machine includes a toroidal vacuum dewer (24) which contains a superconducting magnet (10). A radio frequency coil (32) is mounted within a cylindrical bore (26) of the vacuum dewer. A cylindrical, dielectric former (46) supports an RF shield (34), a z-gradient coil (50), an x-gradient coil (52), and a y-gradient coil (54). The x and y-gradient coils are each composed of four like spiral coil constructions. A metallic layer is cut with cut lines (64) to define a generally spiral coil winding pattern. In a high current density region (68) in which the coil windings are narrower than a preselected width, the cut lines (76) are thinner. In lower current density regions (70), the cut lines (78) are thicker. In lower current density regions, two cut lines are defined between adjacent coil windings such that the coil windings are limited to a maximum width. Conductive islands (80) defined in the lower current density areas which are large enough to support detrimental eddy currents are preferably removed or at least modified such that their ability to support detrimental eddy currents is curtailed.

25 Claims, 3 Drawing Sheets

MAGNETIC RESONANCE GRADIENT SHEET COILS

This application is a continuation-in-part of U.S. applications Ser. Nos. 07/942,521, filed Sep. 9, 1992, 07/859,152, filed Mar. 27, 1992, and 07/859,154, filed Mar. 27, 1992, and of U.S. application Ser. No. 07/922,162, filed Jul. 29, 1992, which, in turn, is a continuation of U.S. application Ser. No. 07/919,215, filed Jul. 24, 1992, and of U.S. application Ser. No. 08/030,601, filed Mar. 11, 1993, which is a continuation of U.S. application Ser. No. 07/805,016, filed Dec. 11, 1991, now abandoned which is a continuation-in-part of U.S. application Ser. No. 07/719,334, filed Jun. 21, 1991, now U.S. Pat. No. 5,177,441, which is a continuation-in-part of U.S. application Ser. No. 07/368,047, filed Jun. 16, 1989, now U.S. Pat. No. 5,036,282.

BACKGROUND OF THE INVENTION

The present invention relates to the magnetic resonance arts. It finds particular application in conjunction with sheet or "fingerprint" type gradient coil designs for magnetic resonance imaging apparatus and will be described with particular reference thereto. However, it will be appreciated that the present invention will also find application in conjunction with the generation of magnetic fields and gradients for other applications.

Heretofore, magnetic resonance imagers have included a superconducting magnet which generated a temporally constant primary magnetic field through a central bore. A series of annular gradient magnetic field coils for generating x, y, and z-gradient magnetic field gradients were mounted to an interior of the bore. An annular radio frequency coil was commonly positioned in the interior of the gradient coils for transmitting radio frequency signals into and receiving radio frequency magnetic resonance signals from a subject in the bore. Current pulses were applied to the gradient and radio frequency coils to generate a series of RF and gradient field pulses of conventional magnetic resonance imaging sequences.

Various coil constructions have been used for generating the x, y, and z magnetic field gradients. One type of gradient coil includes a flexible, dielectric backing layer to which a sheet of copper or other conductive foil material has been laminated. A coil pattern was defined by cutting, milling, or etching the conductive sheet in a generally spiral-like pattern. The conductive sheet remaining between the spiral cut provided a generally spiral or fingerprint-like current path. See, for example, U.S. Pat. No. 5,177,442 to Roemer or U.S. Pat. No. 4,840,700 to Edelstein. The conductive pattern represents an approximation of a continuous current density vector J. Mathematically, the current density $J = \text{curl } S$, where S is a stream function representing contours of constant integrated current density. A number of turns N is selected and the coil is patterned into $N+1$ contours, each of constant S, which differ in magnitude by an amount $\Delta S = S_{max}/N$. Hypothetical contours offset from these by $\Delta S/2$ represent a desired pattern for placing filamentary wires to approximate J.

The contour lines generated by this method determine the machining pattern or cut lines. The cut lines were formed by removing a constant width of the conductor material producing an electrical discontinuity or gap which defines the turn pattern. Typically, the conductive sheet is copper and has a thickness between 1 and 2 mm. The cut lines are typically 2 mm. wide, i.e. about equal to the sheet thickness.

Because the current density function J varies across the sheet, this process of removing a constant width cut line to define the coil pattern results in conductors of varying width. The current can spread in the wide areas and becomes concentrated in the narrow conductor areas such that the selected current density J is better met.

One of the difficulties which arises is that in regions of high current density, only narrow segments of conductor remain between the cut lines, e.g. a width of about 4 mm. This reduction in conductor width from a larger nominal width, e.g. 6 mm, is disadvantageous. The power loss, $I^2R$, increases markedly with the increase in current density in the narrow regions. Moreover, the heat generation rate $\rho J^2$ (where $\rho$ is electrical resistivity), also increases markedly in the high current density regions. Reducing the conductor width from 6 mm. to 4 mm. increases the power loss by a factor of about 1.5 and increases the heat generation rate by a factor of about 2.25. The localized coil heating is a significant disadvantage in the prior art.

Another disadvantage of the prior art is that the wider portions of the conductor support eddy currents. The gradient coil commonly includes a layered assembly of x, y, and z-coils. All three are mounted in very close proximity to one another and are driven in a pulsed manner. When a coil is driven with a current pulse, the resultant magnetic field induces eddy currents in neighboring conductors wherever possible. These eddy currents reduce the driving magnetic field and have an associated decay time. Because the neighboring coils are also fingerprint coils, the available current paths for eddy currents have a non-constant spatial distribution. Thus, the eddy current patterns are spatially dissimilar from the driving field. Both the extended duration of the time decay and the spatial dissimilarity are disadvantageous in magnetic resonance applications. In addition, the electric field generated by the differences in voltages between adjacent coils results in capacitive coupling. Charging this capacitance also has an associated time constant. It is usually desirable to minimize the time constants and currents associated with this process as well.

Wire wound gradient coils also have disadvantages. The wire width is limited by the minimum contour separation distance and the wire height/thickness is limited by radial build constraints. The smallest cross-section is used to wind the entire spiral coil. This results in a coil of higher resistance and higher total heat generation.

In accordance with the present invention, a new and improved gradient coil configuration is provided which overcomes the above-referenced problems and others.

SUMMARY OF THE INVENTION

In accordance with one aspect of the present invention, a gradient coil assembly is provided for causing magnetic field gradients within an examination region. The gradient coil assembly includes a plurality of electrically interconnected coil constructions. Each of the coil constructions includes an electrically conductive foil sheet which is divided by cut lines into a generally spiral electrically conductive foil winding pattern. The foil winding pattern has (1) at least one high current density region in which the windings of the foil winding pattern are narrower than a preselected minimum width and (2) at least one low current density region in which the windings of the foil winding pattern are limited to a preselected maximum width such that gaps are defined between adjacent windings.

In accordance with another aspect of the present invention, an improvement is provided in a gradient coil assembly which includes a plurality of electrically interconnected coil constructions. Each of the coil constructions includes an electrically conductive foil sheet which is divided by cut lines into a generally spiral electrically conductive foil winding pattern. The foil winding pattern has at least one high current density region in which the windings of the pattern are narrower than a preselected minimum width. The windings in other regions of the pattern are at least the preselected minimum width. The improvement comprises defining narrower cut lines in the high current density region than in the other regions of the pattern. The wider cut lines can be mechanically milled, cut by abrasive water jet methods or the like.

In accordance with another aspect of the present invention, a magnetic resonance imaging apparatus is provided. A generally toroidal magnet assembly generates a temporally constant magnetic field through an examination region. The magnet assembly includes a generally cylindrical member which defines a longitudinally extending bore around the examination region. A gradient coil assembly for causing magnetic field gradients within the bore along first, second, and third mutually orthogonal axes is provided. The gradient coil assembly includes a first gradient coil having four electrically interconnected coil constructions for causing gradients along one of the mutually orthogonal axes and a second gradient coil including four electrically interconnected coil constructions offset by 90° relative to the first gradient coil for causing magnetic fields along another of the mutually orthogonal axes. Each of the coil constructions are essentially as described above. A radio frequency coil assembly is disposed within the bore for transmitting radio frequency pulses into the examination region for inducing and manipulating magnetic resonance of selected dipoles. A sequence control means controls the gradient coil assembly and the radio frequency coil assembly for generating magnetic resonance imaging gradient and RF pulse sequences. An image reconstruction means reconstructs the image representations from magnet resonance signals emanating from the examination region.

In accordance with another aspect of the present invention, a method for forming a gradient coil construction from a foil sheet laminated to a dielectric substrate is provided. A generally spiral current winding pattern centroid is selected. An inter-centroid dimension between adjacent centroids is compared with a first preselected width. In regions in which the inter-centroid dimension is less than the first preselected width, a cut line is defined through the coil, which cut line has a first cut line width. In regions in which the intercentroid dimension exceeds the first preselected width, a cut line is defined between adjacent centroids, which cut line has a second cut line width. The first cut line width is smaller than the second cut line width.

In accordance with another aspect of the present invention, another method of forming a gradient coil construction from a foil sheet laminated to a dielectric substrate is provided. A generally spiral current winding pattern centroid is selected. A dimension between adjacent centroids is compared with a preselected width. In regions in which the dimension is wider than the preselected width, two cut lines are defined between adjacent centroids. Each cutting line is displaced from a corresponding adjacent centroid by substantially one half the preselected width. In this manner, isolated islands of foil material are defined between adjacent windings.

In accordance with a more specific aspect of the invention, the islands are removed or segmented to mitigate intra coil eddy currents.

One advantage of the present invention is that it reduces eddy currents in the gradient coils.

Another advantage of the present invention is that it improves the distributions of heat generated by the gradient coil. Heating is reduced in regions of high current density and distributed over regions of lower current density.

Another advantage of the present invention is that it reduces power loss in the gradient coils.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
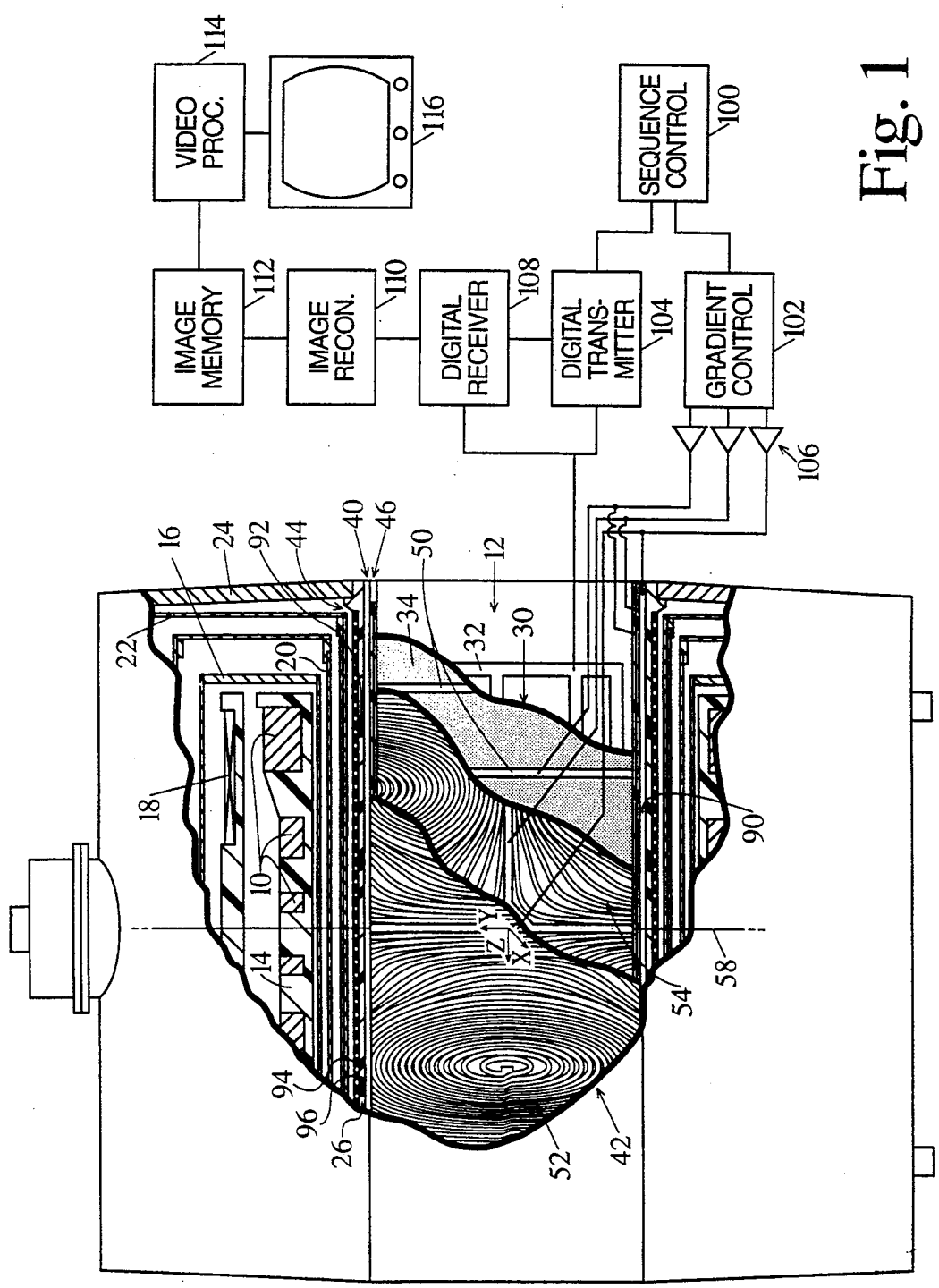
FIG. 1 is a diagrammatic illustration of a magnetic resonance imaging system in accordance with the present invention.

With reference to FIG. 1, a plurality of superconducting magnetic field coils 10 generate a generally temporally constant main magnetic field along a longitudinal or z-axis of a central bore 12. The x and y-axes are defined orthogonal to the z-axis and each other, e.g. horizontally and vertically. Coils of the superconducting magnet are supported by a former 14 and received in a toroidal helium vessel or can 16. The helium vessel is filled with liquid helium to maintain the superconducting magnet at a temperature at which it is superconducting. A main magnetic field shield coil assembly 18 generates a magnetic field which opposes the field generated by the superconducting magnet 10 in regions surrounding the superconducting magnet.

To reduce helium boil-off, the toroidal helium vessel 16 is surrounded by a first cold shield 20 which is maintained at about 20° K. or less. A second cold shield assembly 22 is chilled to about 70° K. or less. The first and second cold shields are preferably cooled by mechanical refrigeration (not shown). Preferably, the cold shield 22 includes a slotted tube cylindrical cold shield portion which is mounted on a cylindrical dielectric former. A toroidal vacuum vessel 24 encases the cold shields to define a vacuum reservoir thereround. The vacuum vessel 24 includes a cylindrical, non-ferrous member 26 that defines the bore 12 and extends parallel to the z-axis. The main magnetic field is generated through the cylindrical member 26. Preferably, layers of aluminized (aluminum coated) mylar superinsulation (not shown) are arranged between the vacuum vessel and the cold shields.

An RF coil assembly 30 is mounted in the bore. The RF coil assembly includes a primary RF coil 32 and an RF shield or secondary coil 34. The primary coil 32, preferably a quadrature or birdcage-type coil, has an inner diameter which defines a patient receiving bore, preferably of at least 55 cm.

A gradient coil assembly 40 includes a primary whole body gradient coil assembly 42 and a secondary coil assembly 44. The primary gradient coil assembly 42 includes a cylindrical dielectric former 46. Preferably, the former has a sufficient thickness to maintain its structural integrity under the forces associated with generating the magnetic field gradients, e.g. 5–10 mm of glass reinforced plastic, preferably about 7.5 mm. The former 46 has a series of grooves 48 defined or cut in its outer surface to receive the windings of a z-gradient coil The RF shield 34, preferably lapped strips of copper foil or fine copper mesh, is applied to the outer surface of the former 46 and through the z-coil receiving grooves. The RF shield mesh may be deformed into the grooves by tightly wound z-gradient wire windings, may be fitted into the grooves, may have solder connected segments extending through the grooves, or the like. The grooves have a depth which generally corresponds to the thickness of the z-gradient coils such that after the z-gradient coils are inserted, a substantially circularly cylindrical surface is presented for receiving x and y-gradient coils 52, 54.

Various alternate embodiments are also contemplated. First, the primary z-gradient coil 50, may be either a distributed or bunched coil. Second, the coil may be constructed with hollow conductor for circulating a cooling fluid. This would enhance cooling efficiency so as to allow higher power levels or gradient strengths. Finally, the z-gradient coil need not be next to the RF screen but can be somewhat removed.

Figure 2:
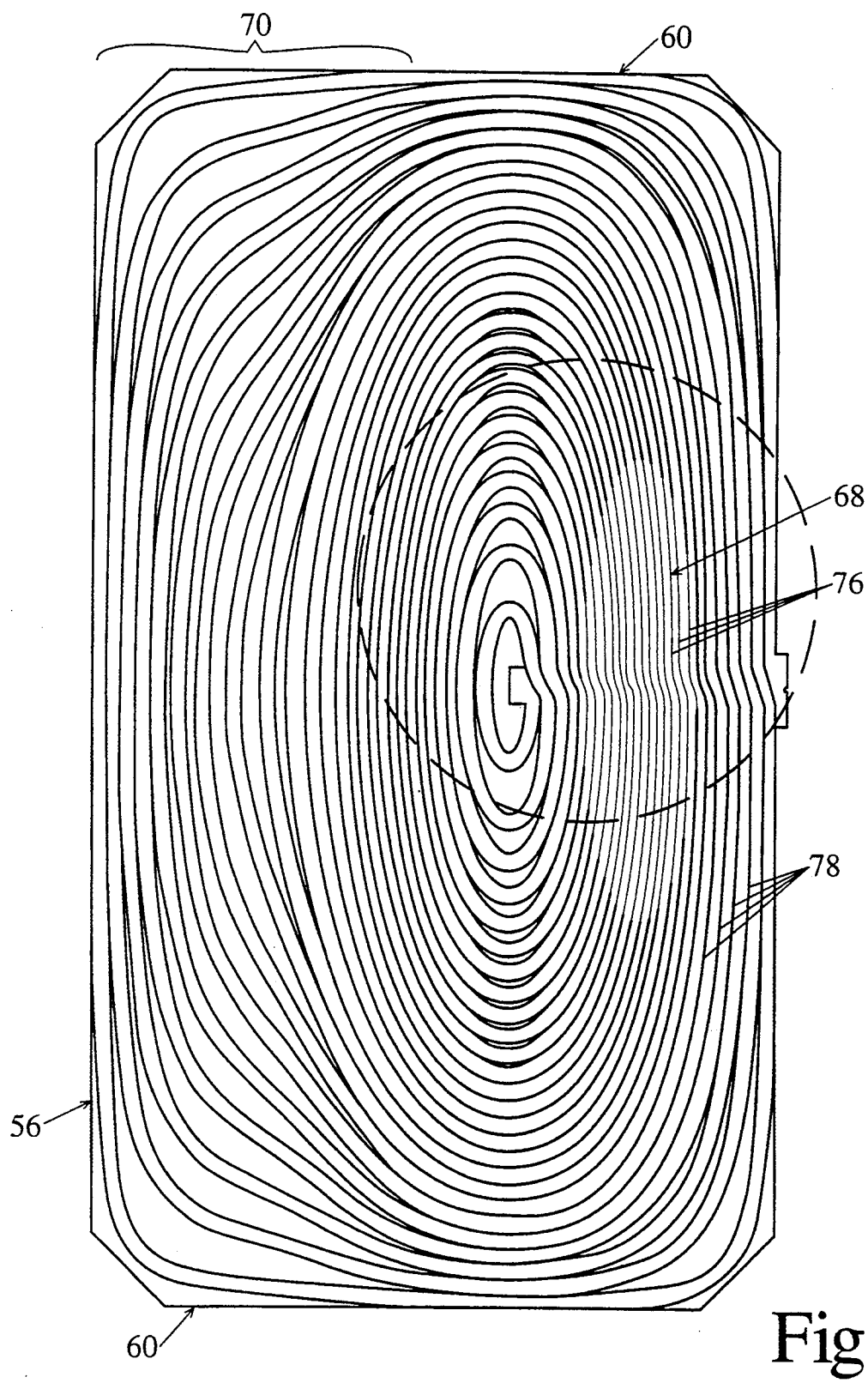
FIG. 2 is a top plan view of a quarter of an x or y-gradient coil laid out flat.

With continuing reference to FIG. 1 and particular reference to FIG. 2, the x and y-gradient coils 52, 54 each include four windings of the pattern shown in FIG. 2. Two of the constructions are mounted with edges 56 generally adjacent each other and on a vertical center plane 58 of the bore. The two constructions wrap about half way around the dielectric former 46. An analogous pair of constructions are mounted on the opposite side of the dielectric former with their edges 56 again adjacent the central vertical plane 58. The constructions wrap around the former such that edges 60 of the oppositely disposed constructions are adjacent each other. The x and y-gradient coils are substantially equivalent to each other, but one is rotated 90° around the central or z-axis relative to the other. The four coil constructions of one of the gradient coils, e.g. the x-gradient coil, are mounted to the dielectric former 46 around the RF shield 34 and the z-gradient coil 50 and the assembly potted in epoxy. The four coil constructions of the other gradient coil, e.g. the y-gradient coil, are mounted around the potted x-gradient coil and also potted in epoxy or other dielectric material. Preferably, the constructions of the outer mounted gradient coil are extended between edges 60 by an appropriate percentage to compensate for the larger diameter about which it is mounted.

Figure 3:
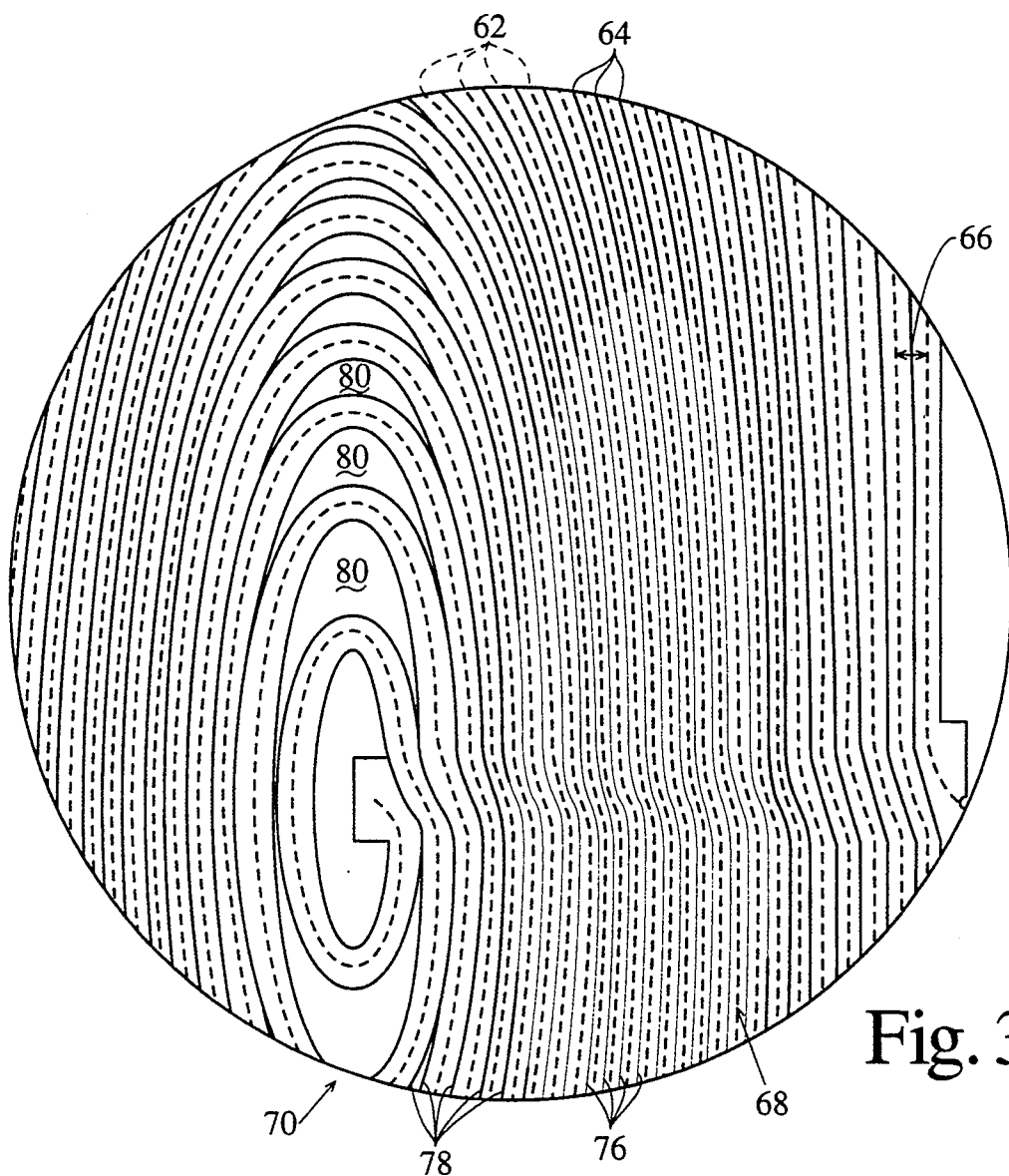
FIG. 3 is an enlargement of a section of the coil construction of FIG. 2.

With continuing reference to FIG. 2 and further reference to FIG. 3, a desired current density J is calculated for each coil construction and a centroid 62 of the current density J is determined. The calculated spiral centroid marks the winding pattern which an ideal filament coil would follow. Cut lines 64 are defined between adjacent centroids. A width 66 of the conductive strip defined between centers of two adjacent cut lines is determined and compared with a preselected minimum width, e.g. 7 mm. and a preselected maximum width, e.g. 12 mm. Where the conductive strips would have a width 66 of less than the preselected minimum, a region 68 of high current density is defined. Where the width 66 between adjacent cut lines would be above the preselected maximum, a region 70 of low current density is defined.

Figure 4:
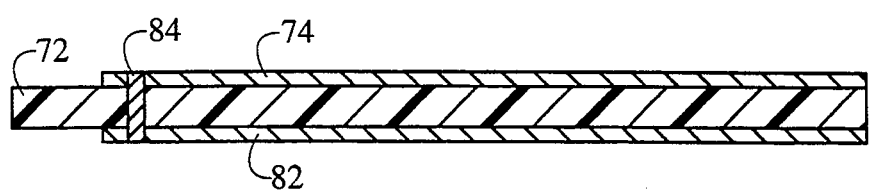
FIG. 4 is a cross-sectional view of an alternate embodiment of the gradient coil of FIG. 2.

With continuing reference to FIGS. 2 and 3 and further reference to FIG. 4, in the preferred embodiment, the coil construction includes a dielectric layer 72 on which a 2 mm. thick film 74 of copper is layered. In the high current density regions 68, narrow cut lines 76 are defined, preferably by a high pressure water jet cutting operation or other numerically controlled machining operator. In the preferred embodiment, the narrow cut lines 76 are about 1 mm. wide or less.

In the regions 68 of higher current density, the width 66 of the copper foil windings is 6 mm. or less. At this narrow width, 1 mm. cut lines leave a significantly higher percentage of conductive material than would 2 mm. cut lines. In regions in which the width 66 is between 7 and 12 mm., wide cut lines 78 are cut with widths of about 2 mm. Although these regions could also be cut with cut lines of 1 mm., 1 mm. cutting operations can be significantly more expensive than 2 mm. cutting operations.

In the regions 70 of low current density, the cut line spacing is limited to a preselected width, e.g. 12 mm., center to center. This limits the width of the conductive portion of the coil to 12 mm. less the 2 mm. cut line thickness, i.e. 10 mm. Preferably, the cut lines are positioned such that the width of the conductive coil segment is as close to 12 mm. as possible throughout the coil. When the width 66 between cut lines is limited in the regions of low current density, islands 80 are formed. Preferably, the islands 80, or at least the larger islands, are removed. Very small islands, which are smaller than the width of the conductors, do not support significant eddy currents and can be retained. Optionally, rather than removing the larger islands, the larger islands may be cut into smaller pieces to prevent their maintaining large eddy currents. Also, it should be noted that one can vary the minimum and maximum prescribed widths depending upon the specific application.

Various, additional techniques may be adopted for limiting eddy currents. First, as illustrated in FIG. 4, a second foil layer 82 may be mounted to the opposite side of the dielectric layer. With two conductive layers, each layer may be half as thick. Hence, any eddy currents induced in the conductors will have a shorter time constant. Moreover, the winding pattern of the two conductive layers need not be the same. Rather, the current density J may be calculated with twice as many, i.e. 2N, loops with alternate loops being defined on each face. Alternate ones of the N loops can be formed on opposing faces allowing each loop to be twice as wide in the high current density region. As yet another alternative, the second conductive layer 82 may be defined only in the region 68 of high current density. The cut lines are directly over top of each other, such that analogous conductive strips are formed on both sides of the high current density region. Electrical connectors, such as copper pins 84, are drilled through the dielectric layer to interconnect the upper and lower conductive strips. The top and bottom conductive strips need not be the same thickness. Rather, the thickness of one or both of the layers can be adjusted such that the combined current carrying capacity of the upper and lower strips matches the current carrying capacity of strips in other regions of the coil construction. The use of thinner conductors are advantageous in that they facilitate defining the cut lines by photoetching techniques. As yet another alternative, the thickness of the conductive layer may be adjusted to be thinner in the areas of less current density and thicker in the areas of higher current density. To the extent that conductor portions would be so wide that they might support eddy currents, additional cut lines can be used to divide these portions into a plurality of parallel conductors connected electrically in parallel.

With reference again to FIG. 1, a plurality of plastic I-beams or other mechanical structures 90 mount the gradient former 46 to the interior surface of the cylindrical member 26 of the superconducting magnet. The I-beams or other mechanical supports 90 define a sufficient gap for receiving main magnet field shims (not shown), typically a multiplicity of ferrous elements, for shimming the uniformity of the main magnetic field. Preferably, an annulus of about 33 mm is provided between the primary gradient coil former 46 and the cylindrical member 26. This provides passages for air cooling, displaces the primary and shield gradient coils a maximal amount, and provides a compartment within which to insert magnetic field shims for shimming the uniformity of the main magnetic field.

The secondary gradient coil 44 includes the cylindrical member 26 which preferably has grooves for receiving a z-gradient shield coil 92. X and y-gradient shield or secondary coils 94, 96 are mounted on the outer circular periphery of the former 26 and potted in an epoxy compound. The primary and secondary gradient coils are connected in series, or independently driven, to create accurate gradient magnetic fields in the bore 12 and cancelling magnetic fields outside the bore, particularly in the vacuum vessel.

A sequence control means 100 controls a gradient coil control means 102 and a transmitter 104. The gradient coil control 102 is connected with a series of current pulse generators 106 which, in turn, are connected with the primary gradient coils 50, 52, 54 and the secondary gradient coils 92, 94, 96. The transmitter 104, preferably a digital transmitter, is connected with the primary radio frequency coil for generating pulses of radio frequency signals for exciting and manipulating magnetic resonance in selected dipoles of a portion of a subject within the bore. A radio frequency receiver 108, preferably a digital receiver, is connected with the radio frequency primary coil or surface coils (not shown) for demodulating magnetic resonance signals emanating from the examined portion of the subject. An image reconstruction means 110, such as an inverse two-dimensional Fourier transform reconstruction means, reconstructs the received magnetic resonance signals into an electronic image representation that is stored in an image memory 112. A video processor 114 converts electronic images stored in the memory 112 into appropriate format for display on a video monitor 116.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
a toroidal magnet assembly for generating a temporally constant magnetic field through an examination region, the magnet assembly including a cylindrical member which defines a longitudinally extending bore around the examination region;
a first gradient coil including at least one electrically conductive sheet which is divided by cut lines into windings of a spiral electrically conductive winding pattern, the winding pattern having higher and lower current density regions, in the higher current density regions of the winding pattern, the windings reach a preselected minimum width, in the lower current density regions of the winding pattern, the windings are wider than the preselected minimum width and narrower than a preselected maximum width, in the lower current density regions, the windings are spaced wider apart than one cut line;
a second gradient coil including at least one electrically conductive sheet which is divided by cut lines into windings of a spiral electrically conductive winding pattern, the winding pattern having higher and lower current density regions, in the higher current density regions of the winding pattern, the windings reach a preselected minimum width, in the lower current density regions of the winding pattern, the windings are wider than the preselected minimum width and narrower than a preselected maximum width, in the lower current density regions, the windings are spaced by more than one cut line the four electrically conductive sheet of the second gradient coil is rotated 90° around the cylinder relative to the electrically conductive sheet of the first gradient coil;
a gradient control connected with the first and second gradient coils for supplying electrical current to the first gradient coil electrically conductive sheet and the second gradient coil electrically conductive sheet for causing magnetic field gradients within the bore along first, second, and third mutually orthogonal axes;
a radio frequency coil assembly disposed within the bore;
a radio frequency transmitter connected with the radio frequency coil assembly for transmitting radio frequency pulses into the examination region for inducing and manipulating magnetic resonance of selected dipoles within the examination region;
a sequence control for controlling the gradient coil control and the radio frequency transmitter for generating magnetic resonance imaging gradient and RF pulse sequences;

an image reconstruction processor for reconstructing image representations from the magnetic resonance signals emanating from the examination region.

2. The magnetic resonance imaging apparatus as set forth in claim 1 wherein the lower current density regions, islands of conductive sheet material which are electrically isolated from the rest of the coil are defined between adjacent foil windings.

3. The magnetic resonance imaging apparatus as set forth in claim 1 wherein the cut lines are narrower in the higher current density regions than in the lower current density regions.

4. The magnetic resonance imaging apparatus as set forth in claim 3 wherein the conductive sheets have a constant thickness, the cut line width in the higher current density region being less than the conductive sheet thickness and the cut line width in the lower current density regions being at least the conducting sheet thickness.

5. The magnetic resonance imaging apparatus as set forth in claim 4 wherein the conductive sheet thickness is at least 2 mm.

6. The magnetic resonance imaging apparatus as set forth in claim 1 wherein the first winding pattern is defined in foil laminated to one face of a dielectric sheet and further including a second winding pattern defined on an opposite face of the dielectric sheet.

7. The magnetic resonance imaging apparatus as set forth in claim 6 wherein the set winding pattern extends in a generally spiral pattern.

8. The magnetic resonance imaging apparatus as set forth in claim 6 wherein the second winding pattern extends adjacent the regions of higher current density, the second winding pattern being electrically connected with the first winding pattern at the higher current density regions.

9. The magnetic resonance imaging apparatus as set forth in claim 1 wherein the windings are thicker in the regions of higher current density and thinner in the lower current density regions.

10. A magnetic resonance imaging apparatus comprising:
a toroidal magnet assembly for generating a temporally constant magnetic field through an examination region, the magnet assembly including a cylindrical member which defines a longitudinally extending bore around the examination region;
a first gradient coil including an electrically conductive sheet which is divided by cut lines into windings of a generally spiral electrically conductive winding pattern, the winding pattern having higher and lower current density regions, the windings in the higher current density regions have a width below a preselected width, the windings in the lower current density regions being at least the preselected width, the cut lines being narrower in the higher current density region than in the lower current density regions;
a second gradient coil including electrically conductive sheet which is divided by cut lines into a generally spiral electrically conductive winding pattern, the winding pattern having higher and lower current density regions, the windings in the higher current density regions of the winding pattern have a width below the preselected width, the windings in the lower current density regions of the winding pattern being at least the preselected width, the cut lines are narrower in the higher current density region than in the lower current density regions;
a gradient control connected with the first and second gradient coils for supplying electrical current to the first and second gradient coil electrically conductive sheets for causing magnetic field gradients within the bore along first, second, and third mutually orthogonal axes;
a radio frequency coil assembly disposed within the bore;
a radio frequency transmitter connected with the radio frequency coil assembly for transmitting radio frequency pulses into the examination region for inducing and manipulating magnetic resonance of selected dipoles within the examination region;
a sequence control for controlling the gradient coil control and the radio frequency transmitter for generating magnetic resonance imaging gradient and RF pulse sequences;
an image reconstruction processor for reconstructing image representations from the magnetic resonance signals emanating from the examination region.

11. The magnetic resonance imaging apparatus as set forth in claim 10 wherein the conductive sheets are a foil of constant thickness, the cut line width in the higher current density region being half the foil thickness and the cut line width in the lower regions of the coil assembly being at least the foil thickness.

12. The magnetic resonance imaging apparatus as set for the in claim 11 wherein the foil thickness is at least substantially 2 mm.

13. The magnetic resonance imaging apparatus as set forth in claim 10 wherein in the lower current density regions, the windings are wider than in the high current density regions, the width of the windings having a maximum width in the lower current density region.

14. The magnetic resonance imaging apparatus as set forth in claim 13 wherein the windings have a substantially constant width in the regions of lower current density.

15. A gradient coil assembly for causing magnetic field gradients within an examination region, the gradient coil assembly comprising:
at least one electrically conductive layer which is divided by cut lines into windings of a generally spiral electrically conductive winding pattern, the winding pattern having (i) at least one region in which the windings have a width less than a preselected maximum width and are disposed adjacent each other separated by a cut line and (ii) at least one region in which the windings of the winding pattern have a width less than a preselected maximum width and are displaced from each other by wider than the cut line such that gaps are defined between adjacent windings.

16. The gradient coil assembly as set forth in claim 15 wherein electrically isolated foil islands are defined in the gaps.

17. The gradient coil assembly as set forth in claim 15 wherein the windings have at least one region in which windings of the winding pattern are narrower than a preselected minimum width.

18. The gradient coil assembly as set forth in claim 15 wherein the windings have a fixed common width in the region in which gaps are defined between adjacent windings.

19. In a gradient coil assembly which includes a plurality of electrically conductive layers which are each divided by cut lines into a generally spiral electrically conductive winding pattern, the winding pattern having at least one region in which windings of the winding pattern are narrower than a preselected minimum width, the windings in other regions of the winding pattern being at least the preselected minimum width, THE IMPROVEMENT COMPRISING:

the cut lines being narrower in said at least one region than in the other regions.

20. A method of forming a gradient coil construction from a conductive layer laminated to a dielectric substrate, the method comprising:

selecting a generally spiral current winding pattern centroid;

comparing a dimension between adjacent centroids with a first preselected width, in regions in which the dimension distance is narrower than the first preselected width, defining a cut line through the conductive layer with a first cut line width and in regions in which the dimension exceeds the first preselected width, defining a cut line of a second cut line width between adjacent centroids, the first cut line width being smaller than the second cut line width.

21. The method as set forth in claim 20 further including comparing inter-centroid dimension with a second preselected width, when the inter-centroid dimension exceeds the second preselected width, defining two cut lines between adjacent centroids, each cut line being displaced from a corresponding adjacent centroid by substantially one half the second preselected width, whereby islands of conductive layer material are defined between adjacent windings.

22. The method as set forth in claim 21 wherein the first and second preselected widths are the same.

23. The method as set forth in claim 21 further including removing the islands to prevent eddy currents from being supported therein.

24. The method as set forth in claim 21 further including modifying the islands to reduce the islands' ability to support eddy currents.

25. A method of forming a gradient coil construction from a conductive layer laminated to a dielectric substrate, the method comprising:

selecting a generally spiral current winding pattern centroid;

comparing a dimension between adjacent centroids with a preselected width, in regions in which the dimension is wider than the preselected width, defining two cut lines between adjacent centroids, each cut line being displaced from a corresponding adjacent centroid by substantially one half the preselected width, whereby isolated islands of conductive material are defined between adjacent windings.

* * * * *